US 10,964,681 B2

(12) United States Patent
Matsuura

(10) Patent No.: US 10,964,681 B2
(45) Date of Patent: Mar. 30, 2021

(54) SEMICONDUCTOR DEVICE AND METHOD FOR MANUFACTURING THE SAME

(71) Applicant: Toshiba Memory Corporation, Tokyo (JP)

(72) Inventor: Eigo Matsuura, Toshima Tokyo (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 0 days.

(21) Appl. No.: 16/290,488

(22) Filed: Mar. 1, 2019

(65) Prior Publication Data
US 2020/0043907 A1    Feb. 6, 2020

(30) Foreign Application Priority Data
Aug. 3, 2018    (JP) ............................. JP2018-146821

(51) Int. Cl.
| H01L 23/48 | (2006.01) |
|---|---|
| H01L 25/18 | (2006.01) |
| H01L 23/00 | (2006.01) |
| H01L 23/31 | (2006.01) |
| H01L 25/00 | (2006.01) |

(52) U.S. Cl.
CPC .......... *H01L 25/18* (2013.01); *H01L 23/3121* (2013.01); *H01L 24/09* (2013.01); *H01L 24/33* (2013.01); *H01L 24/49* (2013.01); *H01L 24/73* (2013.01); *H01L 25/50* (2013.01); *H01L 2224/73265* (2013.01)

(58) Field of Classification Search
CPC ................. H01L 25/115; H01L 25/117; H01L 2224/73265
USPC ................................ 257/618, 622, 686, 723
See application file for complete search history.

(56) References Cited

U.S. PATENT DOCUMENTS

| 5,804,004 A * | 9/1998 | Tuckerman | H01L 24/78 |
| | | | 156/60 |
| 6,091,138 A * | 7/2000 | Yu | H01L 25/0652 |
| | | | 257/686 |
| 6,580,152 B2 | 6/2003 | Hasegawa | |
| 7,148,081 B2 | 12/2006 | Higashino et al. | |
| 7,179,685 B2 | 2/2007 | Egawa | |
| 7,282,793 B2 * | 10/2007 | Akram | H01L 23/3185 |
| | | | 257/685 |

(Continued)

FOREIGN PATENT DOCUMENTS

| JP | 2004-031754 A | 1/2004 |
| JP | 3530158 B2 | 5/2004 |

(Continued)

*Primary Examiner* — Nitin Parekh
(74) *Attorney, Agent, or Firm* — Kim & Stewart LLP

(57) ABSTRACT

A semiconductor device includes a substrate, first and second semiconductor chips, an adhesion layer, and a resin layer. The first and second semiconductor chips are provided on a surface of the substrate. The second semiconductor chip includes, on a side thereof facing the substrate, a first region and a second region that is recessed from the first region and is above at least part of the first semiconductor chip or at least part of a wire that electrically connects the first semiconductor chip and the substrate. The adhesion layer is provided at least between the first region of the second semiconductor chip and the substrate. The resin layer is on the surface of the substrate and enclosing the first and second semiconductor chips.

20 Claims, 12 Drawing Sheets

(56) References Cited

U.S. PATENT DOCUMENTS

| | | | |
|---|---|---|---|
| 8,772,929 B2* | 7/2014 | Chen | H01L 25/50 |
| | | | 257/737 |
| 8,841,765 B2* | 9/2014 | Haba | H01L 25/0657 |
| | | | 257/724 |
| 8,896,111 B2 | 11/2014 | Tanimoto et al. | |
| 9,052,446 B2 | 6/2015 | Lee | |
| 2002/0096755 A1* | 7/2002 | Fukui | H01L 24/27 |
| | | | 257/686 |
| 2003/0038378 A1* | 2/2003 | Jacobs | H01L 21/4857 |
| | | | 257/783 |
| 2003/0111720 A1 | 6/2003 | Tan et al. | |
| 2003/0230801 A1* | 12/2003 | Jiang | H01L 25/105 |
| | | | 257/723 |
| 2004/0245652 A1* | 12/2004 | Ogata | H01L 25/50 |
| | | | 257/777 |
| 2005/0062166 A1* | 3/2005 | Kang | H01L 24/48 |
| | | | 257/777 |
| 2006/0012022 A1 | 1/2006 | Ararao et al. | |
| 2007/0284139 A1* | 12/2007 | Chin | B28D 5/029 |
| | | | 174/260 |
| 2013/0149215 A1* | 6/2013 | Dekker | H01L 37/00 |
| | | | 422/502 |

FOREIGN PATENT DOCUMENTS

| | | |
|---|---|---|
| JP | 2006-222470 A | 8/2006 |
| JP | 3970833 B2 | 9/2007 |
| JP | 3970849 B2 | 9/2007 |
| JP | 2009-026843 A | 2/2009 |
| JP | 4275113 B2 | 6/2009 |
| TW | 201411806 A | 3/2014 |
| TW | 201438268 A | 10/2014 |
| TW | 201803063 A | 1/2018 |

* cited by examiner though the size of the entire package to be reduced relative to a structure in which a plurality of semiconductor chips is simply arranged horizontally side by side. However, the spacer chip may increase the cost of the semiconductor device.

SEMICONDUCTOR DEVICE AND METHOD FOR MANUFACTURING THE SAME

CROSS-REFERENCE TO RELATED APPLICATION

This application is based upon and claims the benefit of priority from Japanese Patent Application No. 2018-146821, filed on Aug. 3, 2018, the entire contents of which are incorporated herein by reference.

FIELD

Embodiments described herein relate generally to a semiconductor device and a method for manufacturing the same.

BACKGROUND

In a semiconductor device of one type, a plurality of semiconductor chips, such as a memory chip and a controller chip therefor, is sealed in one package. For such a semiconductor device, there is a package structure in which the memory chip is heightened using a spacer chip and is then disposed in an overlapping manner above the controller chip. Such a package structure enables the size of the entire package to be reduced relative to a structure in which a plurality of semiconductor chips is simply arranged horizontally side by side. However, the spacer chip may increase the cost of the semiconductor device.

Moreover, there is another package structure in which, a thick die attach film (DAF) is used instead of the spacer chip. However, according to this package structure, the memory chip is more likely to be tilted, or the shape of the memory chip itself may become distorted. If the memory chip becomes tilted or distorted, it becomes more difficult to stack another memory chip on the tilted or distorted memory chip, because the stacked memory chips become likely to detached from each other and it becomes more difficult to connect bonding wires. Moreover, if the DAF is squashed, the memory chip may come into contact with a controller chip below it. Furthermore, if the DAF is squashed, the DAF may protrude from below the memory chip to a bonding pad. As a result, it may become difficult to bond a metal wire to the bonding pad.

DETAILED DESCRIPTION

Figure 1A:
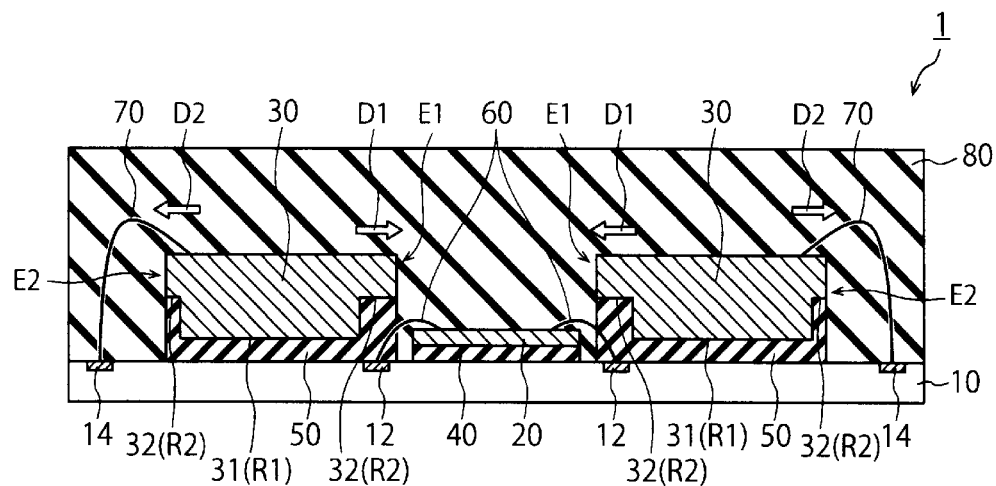
FIGS. 1A and 1B respectively illustrate a cross-sectional view and a plan view of a semiconductor device according to a first embodiment.

Embodiments provide a semiconductor device directed to reducing a package size thereof by, without using a spacer chip, locating one semiconductor chip above the other semiconductor chip and a method for manufacturing the same.

In general, according to an embodiment, a semiconductor device includes a substrate, first and second semiconductor chips, an adhesion layer, and a resin layer. The first and second semiconductor chips are provided on a surface of the substrate. The second semiconductor chip includes, on a side thereof facing the substrate, a first region and a second region that is recessed from the first region and is above at least part of the first semiconductor chip or at least part of a wire connecting between the first semiconductor chip and the substrate. The adhesion layer is provided at least between the first region of the second semiconductor chip and the substrate. The resin layer is on the surface of the substrate and enclosing the first and second semiconductor chips.

Hereinafter, embodiments according to the present disclosure will be described with reference to the drawings. The embodiments described below are not intended to limit the present disclosure. In the following embodiments, the vertical directions indicate relative directions obtained when a surface on which a semiconductor chip is mounted to a substrate is assumed to be the upper side, and may differ from the vertical directions defined according to the acceleration of gravity. The drawings are schematic or conceptual ones, and, for example, the ratios of various portions are not necessarily the same as the reality. In the specification and the drawings, elements similar to those previously described with reference to the previously-discussed drawings are assigned the respective same reference characters, and the detailed description thereof is omitted as appropriate.

First Embodiment

Figure 1B:
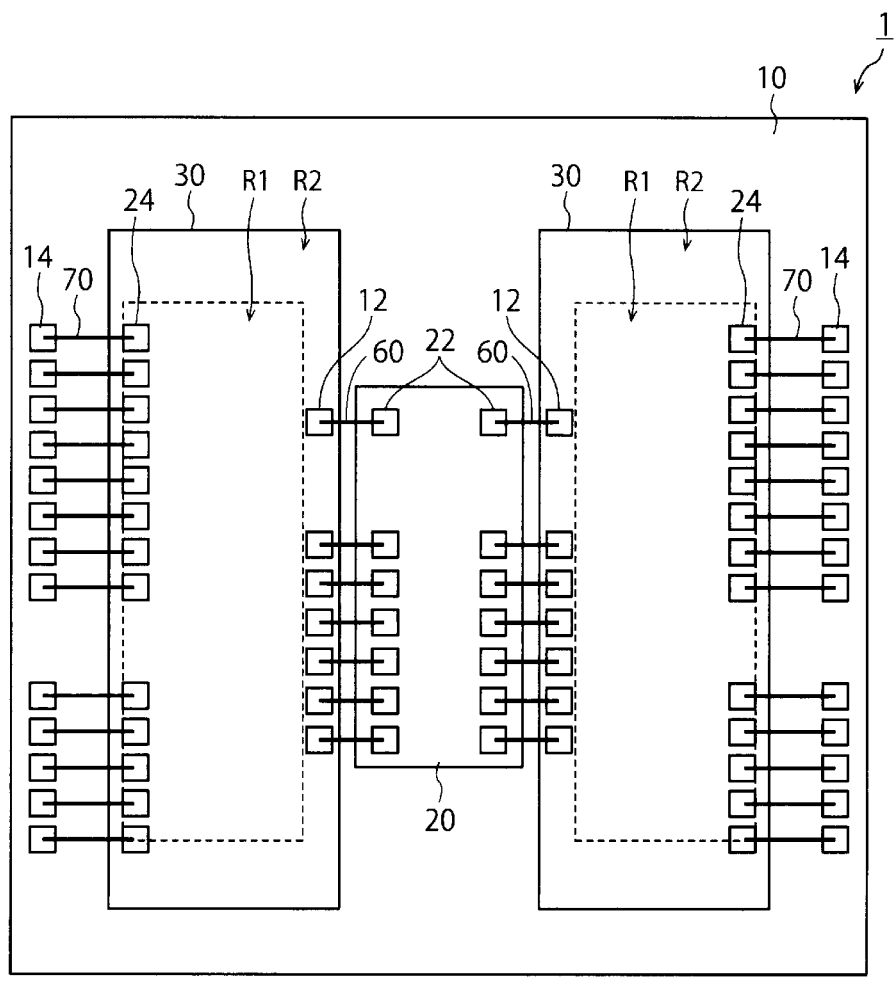

FIGS. 1A and 1B respectively illustrate a cross-sectional view and a plan view of a semiconductor device 1 according to a first embodiment. The semiconductor device 1 includes a resin substrate 10, a controller chip 20, a memory chip 30, adhesion layers 40 and 50, metal wires 60 and 70, and a mold resin 80. The semiconductor device 1 in the present embodiment is a surface mount-type semiconductor package, and may be, for example, a ball grid array package (BGA) or a land grid array package (LGA). The semiconductor device 1 may also be, for example, a semiconductor storage device such as a NAND-type flash memory.

The resin substrate 10 serving as a substrate may be, for example, a multi-layer wiring substrate in which a plurality of insulating layers and a plurality of wiring layers (each not illustrated) are integrated while being stacked in layers one by one. The insulating layer is made from, for example, a resin material, such as glass epoxy resin, an organic polymeric material, or a ceramic material (for example, aluminum oxide ($Al_2O_3$)). The wiring layer is provided in the resin substrate 10 and is electrically connected to a bonding pad. The wiring layer is made from, for example, a low-resistance conducting material such as copper. The planar shape of the resin substrate 10 is not particularly limited, and may be an approximate rectangle or approximate square as illustrated in FIG. 1B.

Bonding pads 12 and 14 are provided on an obverse side of the resin substrate 10. The metal wires 60 and 70 are bonded to the bonding pads 12 and 14. The metal wires 60 and 70 are made from, for example, gold.

The controller chip 20 serving as a first semiconductor chip is bonded and fixed to the obverse side of the resin substrate 10 via an adhesion layer (die attach film (DAF)) 40. The controller chip 20 is a semiconductor chip which controls the memory chip 30, and is configured such that a semiconductor element (for example, a transistor) configuring a control circuit is provided on the surface of a semiconductor substrate. Moreover, the controller chip 20 has bonding pads 22 connected to the control circuit provided therein, and the bonding pads 22 are electrically connected to the bonding pads 12 of the resin substrate 10 via the metal wires 60.

The memory chip 30 serving as a second semiconductor chip is bonded and fixed to the obverse side of the resin substrate 10 via an adhesion layer (DAF) 50. The memory chip 30 is, for example, a semiconductor chip having a NAND-type flash memory, and is configured such that a planar-type or three-dimensional-type memory cell array is provided on the surface of a semiconductor substrate. Moreover, the memory chip 30 has bonding pads 24 connected to the control circuit provided therein, and the bonding pads 24 are electrically connected to the bonding pads 14 of the resin substrate 10 via the metal wires 70. With this, the memory chip 30 is electrically connected to the controller chip 20 via the metal wires 60 and 70 and the internal wiring lines of the resin substrate 10 and is thus able to operate under the control of the controller chip 20.

As illustrated in FIG. 1A, the reverse side of the memory chip 30 has a projecting portion 31 projecting in a first area R1. Moreover, the reverse side of the memory chip 30 has a recess portion 32 recessed in a second area R2 of the reverse side other than the first area R1. When the projecting portion 31 is bonded to the obverse side of the resin substrate 10, the recess portion 32 in the second area R2 is located in overlapping manner above at least a portion of the metal wire 60 connecting between the controller chip 20 and the resin substrate 10. At this time, the recess portion 32 is not in contact with the controller chip 20 and the metal wire 60.

The adhesion layer 50 is provided between the first area R1 and the resin substrate 10, and is used to bond the projecting portion 31 to the obverse side of the resin substrate 10. In addition, the adhesion layer 50 is also provided between the second area R2 and the resin substrate 10, and is used to bond the recess portion 32 to the resin substrate 10. Moreover, the adhesion layer 50 located between the second area R2 and the resin substrate 10 is in contact with a part of the metal wire 60 and the bonding pad 12, thus covering those. In other words, when viewed from above the obverse side of the resin substrate 10, the second area R2 of the memory chip 30 overlaps at least a part of the metal wire 60.

In this way, providing the projecting portion 31 and the recess portions 32 on the reverse side of the memory chip 30 enables protruding the second area R2 of the memory chip 30 toward the controller chip 20 without bringing the memory chip 30 into contact with the controller chip 20 and the metal wire 60. This enables causing the memory chip 30 to overlap above the controller chip 20 or the metal wire 60, thus enabling reducing the size of the entire semiconductor device 1.

In order for the memory chip 30 not to come into contact with the controller chip 20 even when the second area R2 is protruded toward the controller chip 20, it is favorable that the difference in thickness of the memory chip 30 between the second area R2 and the first area R1 is larger than the thickness of the controller chip 20. Moreover, in order for the metal wire 60 not to come into contact with the controller chip 20 even when the second area R2 is protruded toward the controller chip 20, it is favorable that the difference in thickness of the memory chip 30 between the second area R2 and the first area R1 is larger than the height of the metal wire 60.

The mold resin 80 is provided on the resin substrate 10, and covers the controller chip 20, the memory chip 30, and the metal wires 60 and 70. The mold resin 80 protects the controller chip 20, the memory chip 30, and the metal wires 60 and 70 from outside the semiconductor device 1.

As illustrated in FIG. 1B, the first area R1 is located inside the second area R2 and does not protrude to the outside of the second area R2. Moreover, in a cross-section taken in the array direction of the controller chip 20 and the memory chip 30 as illustrated in FIG. 1A, the second area R2 extends in both a first direction D1 leading from the memory chip 30 toward the controller chip 20 and a second direction D2 opposite to the first direction D1. In this case, when the adhesion layer 50 protrudes from the first area R1, the second area R2 receives the protruded adhesion layer 50 and prevents or reduces the adhesion layer 50 from spreading sideways. In other words, in a case where the second area R2 extends from the both sides of the memory chip 30 in the directions D1 and D2, the adhesion layer 50 is received between the second area R2 at an end portion E1 and the resin substrate 10 and between the second area R2 at an end portion E2 and the resin substrate 10.

While the second area R2 is provided at the end portion E1 close to the controller chip 20, the second area R2 at the end portion E2 distant from the controller chip 20 does not necessarily need to be provided. In other words, it is not necessary for the second area R2 to extend in the second direction D2. Even this case enables causing the memory chip 30 to overlap above the metal wire 60. Moreover, the adhesion layer 50 protruded from the end portion E1 of the first area R1 in the direction D1 is received by the second area R2 and is thus able to cover a part of the metal wire 60.

Furthermore, since the metal wire 60 is joined prior to bonding of the memory chip 30, the adhesion layer 50 is allowed to contact the bonding pad 12 and the metal wire 60.

Rather, since the adhesion layer 50 covers the bonding pad 12 and the metal wire 60, the adhesion layer 50 is able to protect the bonding pad 12 and the metal wire 60.

On the other hand, in a case where the second area R2 is not provided at the end portion E2, the adhesion layer 50 protruded from the end portion E2 of the first area R1 in the direction D2 may, in some cases, spread sideways without being received. Since the metal wire 70 is joined after bonding of the memory chip 30, if the adhesion layer 50 is protruded to the bonding pad 14 at the time of mounting of the memory chip 30, it may become impossible to join the metal wire 70 to the bonding pad 14. Accordingly, it is favorable that the second area R2 is also provided at the end portion E2. However, if the adhesion layer 50 spreading sideways does not have an influence on the bonding pad 14 or the metal wire 70, the second area R2 does not need to be provided at the end portion E2.

Moreover, in a planar view as viewed from above the resin substrate 10 as illustrated in FIG. 1B, the second area R2 may be provided at the entire outer circumference of the first area R1 in such way as to surround the first area R1. In this case, not only the adhesion layer 50 protruded in the direction D1 or D2 but also the adhesion layer 50 protruded in directions approximately perpendicular to the direction D1 or D2 in the surface of the reverse side F2 can be received between the second area R2 and the resin substrate 10. As a result, the adhesion layer 50 can be prevented or reduced from excessively spreading.

In the present embodiment, a plurality of memory chips 30 is separately provided on both sides of the controller chip 20. In this case, since no memory chip 30 is provided just above the controller chip 20, the mold resin 80 is provided between the plurality of memory chips 30. This causes the memory chip 30, the controller chip 20, and the metal wires 60 and 70 to be protected by the mold resin 80. A part of the metal wire 60 and the bonding pad 12 are protected by the adhesion layer 50.

According to the present embodiment, the projecting portion 31 is provided in the first area R1 of the reverse side of the memory chip 30. When the projecting portion 31 is bonded to the obverse side of the resin substrate 10, the second area R2 of the memory chip 30 is located above at least a portion of the metal wire 60 without being in contact with the controller chip 20. In a planar view as viewed from above the obverse side of the resin substrate 10, the second area R2 overlaps at least a part of the metal wire 60. This makes the size of the package structure configured according to the present embodiment smaller than a package structure in which the controller chip 20 and the memory chip 30 are merely placed horizontally side by side.

Additionally, the adhesion layer 50 is provided under the second area R2 on the side of the end portion E1 of the memory chip 30. This enables the adhesion layer 50 to cover a part of the metal wire 60 and the bonding pad 12, thus protecting those.

Moreover, the adhesion layer 50 is able to be received under the second area R2 on the side of the end portion E2. This prevents the adhesion layer 50 from protruding from the memory chip 30 to the bonding pad 14 at the time of mounting of the memory chip 30, thus enabling preventing or reducing, for example, contamination of the bonding pad 14.

Additionally, the second area R2 being provided on the entire outer circumference of the first area R1 enables more efficiently preventing or reducing the adhesion layer 50 from protruding from the memory chip 30.

Next, a method for manufacturing the semiconductor device 1 according to the present embodiment is described.

FIG. 2A to FIG. 6B are diagrams illustrating an example of a method for manufacturing the semiconductor device 1 according to the first embodiment. Furthermore, the following method for manufacturing a semiconductor chip is also applicable to any of the controller chip 20 and the memory chip 30.

Figure 2A:
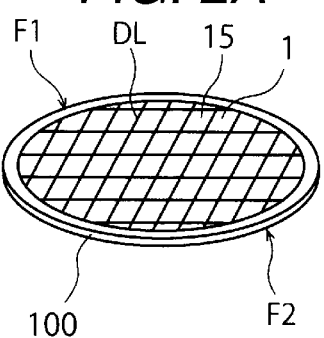
FIGS. 2A and 2B are diagrams illustrating a process of a method for manufacturing the semiconductor device according to the first embodiment.
Figure 2B:
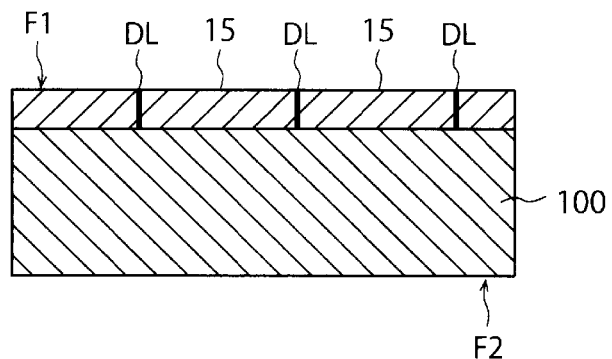

First, as illustrated in FIGS. 2A and 2B, semiconductor elements 15 are formed on the obverse side F1 of a semiconductor wafer 100. A dicing line DL is provided between adjacent semiconductor chips. Furthermore, FIG. 2B illustrates a cross-sectional view of a part of FIG. 2A.

Figure 3A:
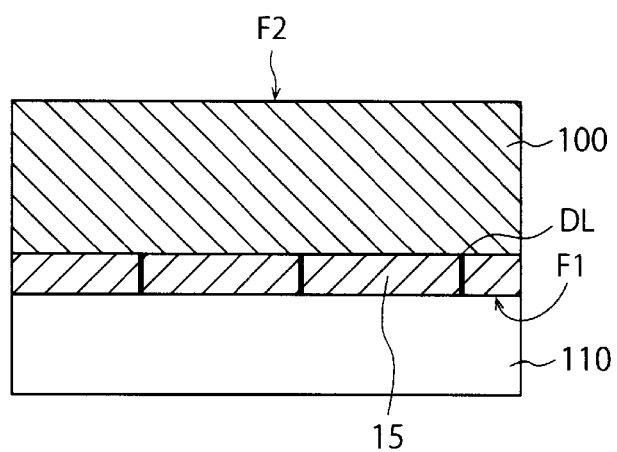
FIGS. 3A and 3B are diagrams illustrating a process of the method for manufacturing the semiconductor device, following the process illustrated in FIGS. 2A and 2B.
Figure 3B:
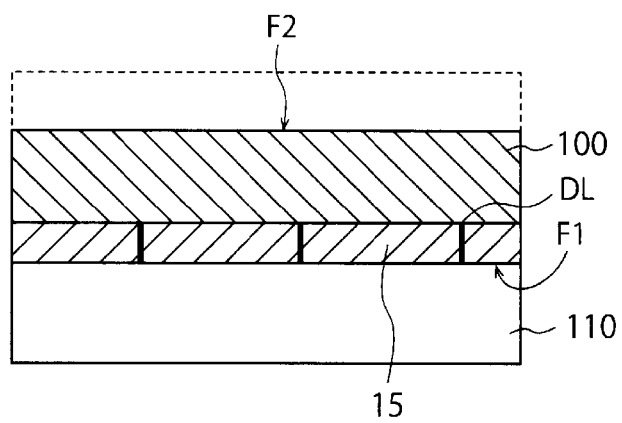

Next, as illustrated in FIG. 3A, a protective tape 110 is attached on the obverse side F1 of the semiconductor wafer 100, and, as illustrated in FIG. 3B, the reverse side F2 of the semiconductor wafer 100 is polished by a chemical mechanical polishing (CMP) method.

Figure 4A:
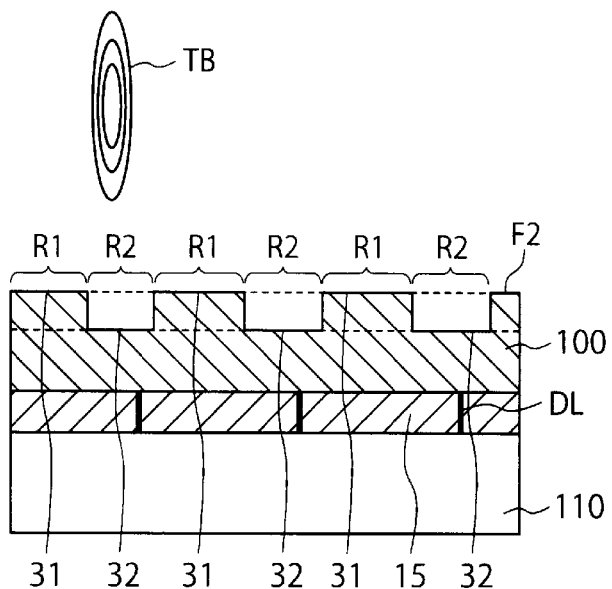
FIGS. 4A and 4B are diagrams illustrating a process of the method for manufacturing the semiconductor device, following the process illustrated in FIGS. 3A and 3B.

Next, as illustrated in FIG. 4A, the second area R2 on the reverse side F2 of the semiconductor wafer 100 is cut by a trim blade TB. This forms the projecting portion 31, which projects in the first area R1 of the reverse side F2, and the recess portion 32, which is recessed in the second area R2 of the reverse side F2, other than the projecting portion 31.

Figure 4B:
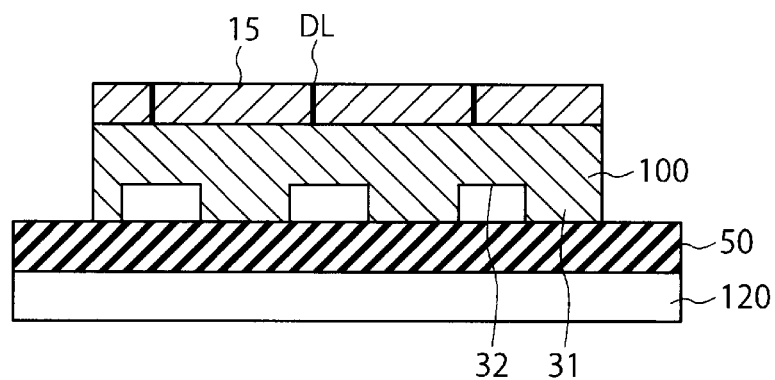
Figure 5A:
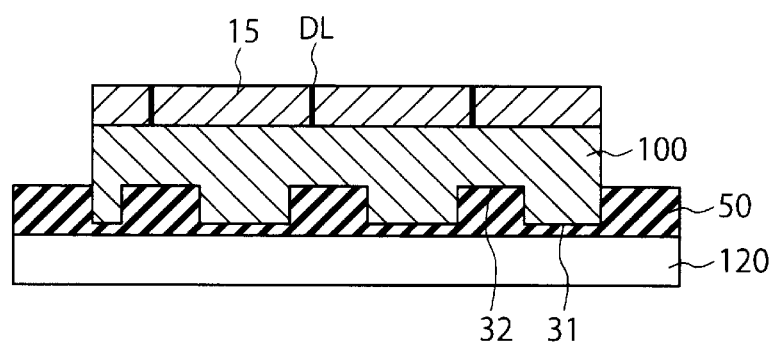
FIGS. 5A and 5B are diagrams illustrating a process of the method for manufacturing the semiconductor device, following the process illustrated in FIGS. 4A and 4B.

Next, as illustrated in FIG. 4B, on a dicing tape 120 having an adhesion layer 50, the semiconductor wafer 100 is mounted with the reverse side F2 facing the adhesion layer 50. Additionally, as illustrated in FIG. 5A, the adhesion layer 50 is embedded into the recess portion 32 of the semiconductor wafer 100 by pressing the semiconductor wafer 100 against the dicing tape 120.

Figure 5B:
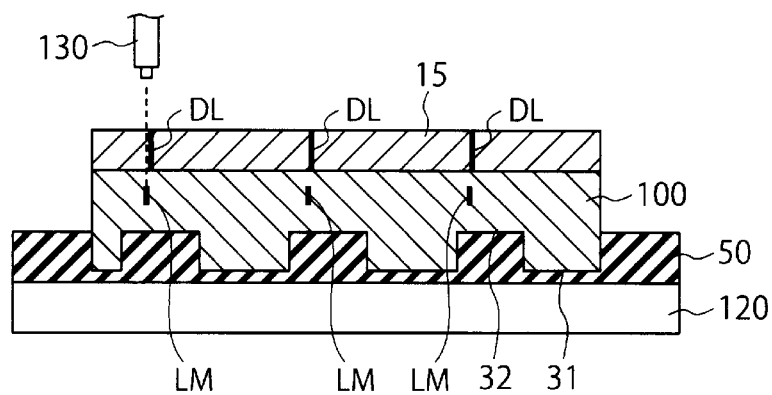

Next, as illustrated in FIG. 5B, laser light is radiated to a portion corresponding to the dicing line DL on the reverse side F2 of the semiconductor wafer 100 with use of a laser oscillator 130. This forms a modified layer LM inside the semiconductor wafer 100.

Figure 6A:
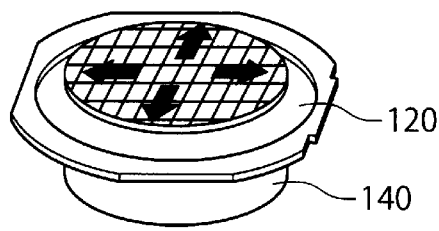
FIGS. 6A and 6B are diagrams illustrating a process of the method for manufacturing the semiconductor device, following the process illustrated in FIGS. 5A and 5B.
Figure 6B:
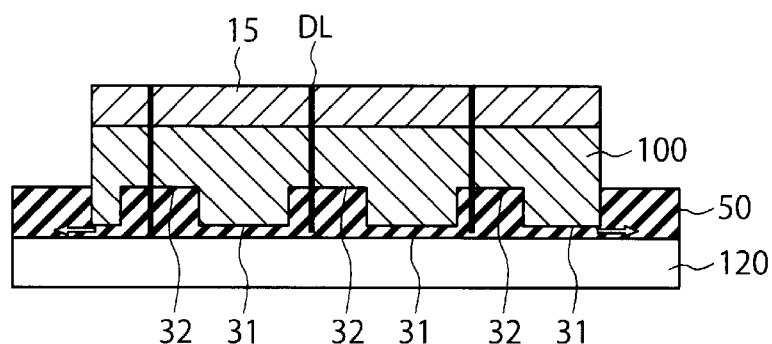

Next, as illustrated in FIG. 6A, the dicing tape 120 is pulled (i.e., expanded) by pushing up the dicing tape 120 from below with a lifting member 140. This causes the semiconductor wafer 100 to be pulled outward together with the dicing tape 120. At this time, as illustrated in FIG. 6B, the semiconductor wafer 100 and the adhesion layer 50 are cleaved along the modified layer LM (i.e., along the dicing line DL) and are thus fragmented into a plurality of semiconductor chips.

After that, each semiconductor chip (i.e., the controller chip 20 and/or the memory chip 30) is picked up and mounted on the resin substrate 10.

For example, the controller chip 20 is mounted on the resin substrate 10. At this time, as illustrated in FIG. 1A, the adhesion layer 40 is used to bond the controller chip 20 onto the resin substrate 10. At this time, the controller chip 20 may be bonded onto the resin substrate 10 by heating the adhesion layer 40.

Next, the controller chip 20 and the bonding pad 12 of the resin substrate 10 are connected via the metal wire 60.

Next, the memory chip 30 is mounted on the resin substrate 10. At this time, as illustrated in FIG. 1A, the adhesion layer 50 is used to bond the memory chip 30 onto the resin substrate 10. The memory chip 30 may be bonded onto the resin substrate 10 by heating the adhesion layer 50. At this time, not only the projecting portion 31 of the memory chip 30 is bonded to the obverse side of the resin substrate 10 with the adhesion layer 50, but also the recess portion 32 is located above the metal wire 60.

The memory chip 30 is located in such a manner that the end portion E1 thereof protrudes to above the metal wire 60, and overlaps apart of the metal wire 60. This enables reducing the size of the semiconductor device 1. At the same time, the adhesion layer 50 on the side of the end portion E1 of the memory chip 30 is used to embed a part of the metal wire 60 and the bonding pad 12, thus being able to protect those.

In the present embodiment, two memory chips 30 are respectively located on both sides of the controller chip 20, and the adhesion layer 50 protects the metal wire 60 and the bonding pad 12 on both sides of the controller chip 20.

Next, the controller chip 20 and the memory chip 30 are sealed with use of the mold resin 80. With this, a package of the semiconductor device 1 illustrated in FIG. 1A is completed.

According to the present embodiment, when the projecting portion 31 of the memory chip 30 is bonded to the obverse side of the resin substrate 10, the recess portion 32 of the memory chip 30 can be located above the metal wire 60 without being in contact with the metal wire 60. This enables causing apart of the memory chip 30 to overlap above the controller chip 20 without using, for example, a spacer chip, thus reducing the size of the package structure.

Additionally, the adhesion layer 50 is provided under the second area R2 on the side of the end portion E1 of the memory chip 30. This enables the adhesion layer 50 to cover a part of the metal wire 60 and the bonding pad 12, thus protecting those.

Moreover, the adhesion layer 50 is able to be received under the second area R2 on the side of the end portion E2. This prevents the adhesion layer 50 from protruding to the bonding pad 14 at the time of mounting of the memory chip 30, thus enabling preventing or reducing, for example, contamination of the bonding pad 14.

Modification Example 1

Figure 7:
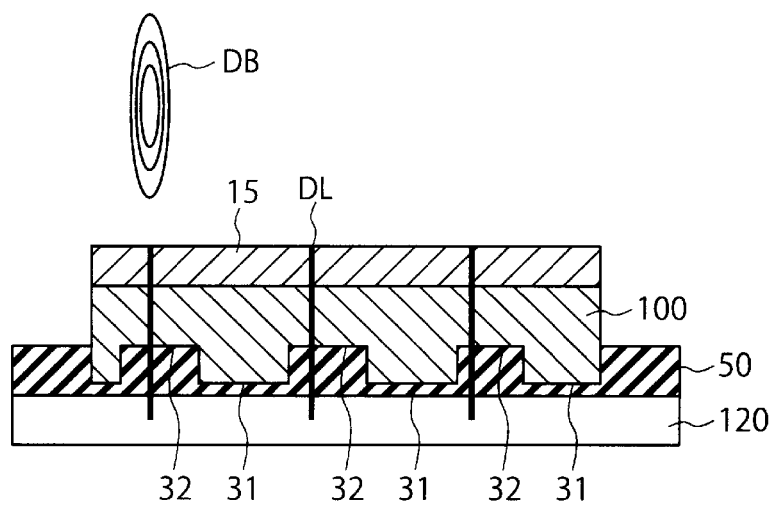
FIG. 7 is a diagram illustrating a process of a method for manufacturing the semiconductor device according to a modification example 1 of the first embodiment.

FIG. 7 is a diagram illustrating a method for manufacturing the semiconductor device 1 according to a modification example 1 of the first embodiment. In the manufacturing method according to the first embodiment, as illustrated in FIG. 5A, after filling the recess portion 32 with the adhesion layer 50, fragmentation into semiconductor chips is performed by laser dicing and expanding.

However, in the modification example 1, instead of laser dicing and expanding, blade dicing is performed. In blade dicing, cutting is performed along the dicing line DL with use of a dicing blade DB illustrated in FIG. 7.

The width (a width in a direction perpendicular to the plane of rotation) of the trim blade is greater than that of the dicing blade. Accordingly, the width of the recess portion 32 is greater than that of the dicing line DL and is greater than the width of an area cut by the dicing blade. With this, even after the fragmentation, the projecting portion 31 and the recess portion 32 remain on the reverse side F2 of the memory chip 30.

Modification Example 2

FIG. 8A to FIG. 9B illustrate cross-sectional views of the semiconductor device 1 to illustrate a method for manufacturing the semiconductor device 1 according to a modification example 2 of the first embodiment.

In the first embodiment, fragmentation into semiconductor chips is performed after trim processing. On the other hand, in the modification example 2, trim processing is performed after the fragmentation into semiconductor chips.

Figure 8A:
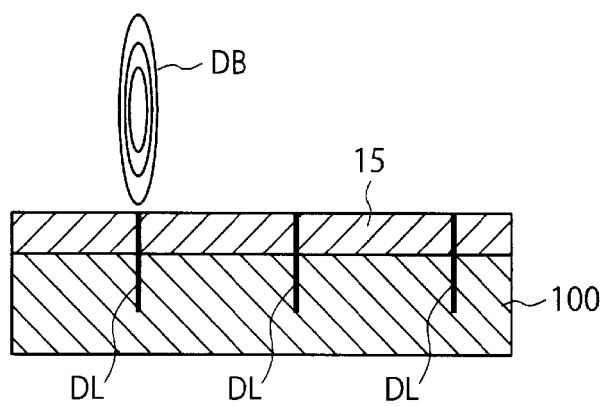
FIGS. 8A and 8B are cross-sectional views of the semiconductor device to illustrate a process of a method for manufacturing the semiconductor device according to a modification example 2 of the first embodiment.

First, after performing the process described with reference to FIGS. 2A and 2B, as illustrated in FIG. 8A, cutting is performed up to a halfway portion of the semiconductor wafer 100 along the dicing line DL with use of the dicing blade DB (i.e., half-cutting).

Figure 8B:
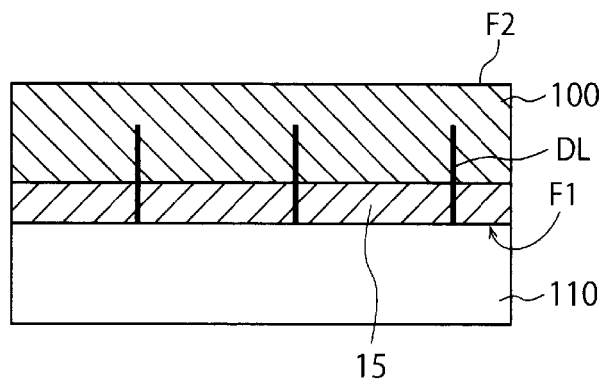
Figure 9A:
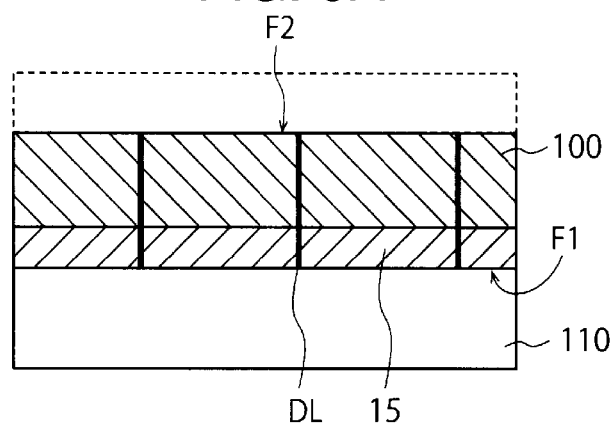
FIGS. 9A and 9B are diagrams illustrating a process of the method for manufacturing the semiconductor device, following the process illustrated in FIGS. 8A and 8B.

Next, as illustrated in FIG. 8B, a protective tape 110 is attached to the obverse side F1 of the semiconductor wafer 100, and, as illustrated in FIG. 9A, the reverse side F2 of the semiconductor wafer 100 is polished by the CMP method. This polishing of the reverse side F2 causes the semiconductor wafer 100 to be fragmented into semiconductor chips.

Figure 9B:
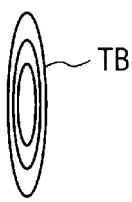
Figure 9B:
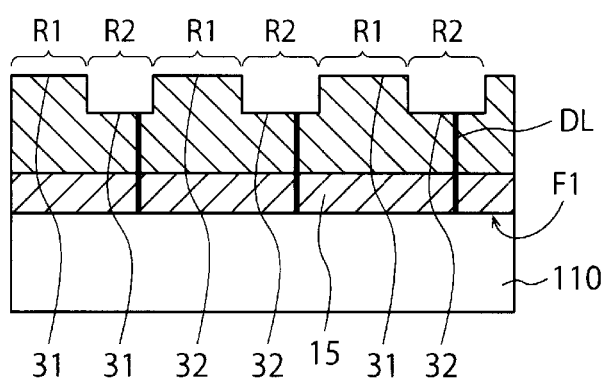

After that, as illustrated in FIG. 9B, the second area R2 on the reverse side F2 of the semiconductor wafer 100 is cut by a trim blade TB. This forms the projecting portion 31, which projects in the first area R1 of the reverse side F2, and the recess portion 32, which is recessed in the second area R2 of the reverse side F2, other than the projecting portion 31. Additionally, after performing the processes described with reference to FIG. 4B to FIG. 5A, semiconductor chips are formed. In the modification example 2, the processes of laser dicing and expanding illustrated in FIG. 5B and FIG. 6A are unnecessary.

After that, after processes similar to those in the first embodiment are performed, the semiconductor device 1 similar to that in the first embodiment is completed. In this way, even when performing trim processing after performing fragmentation into semiconductor chips, the method enables to form the semiconductor device 1 similar to that in the first embodiment.

Second Embodiment

Figure 10:
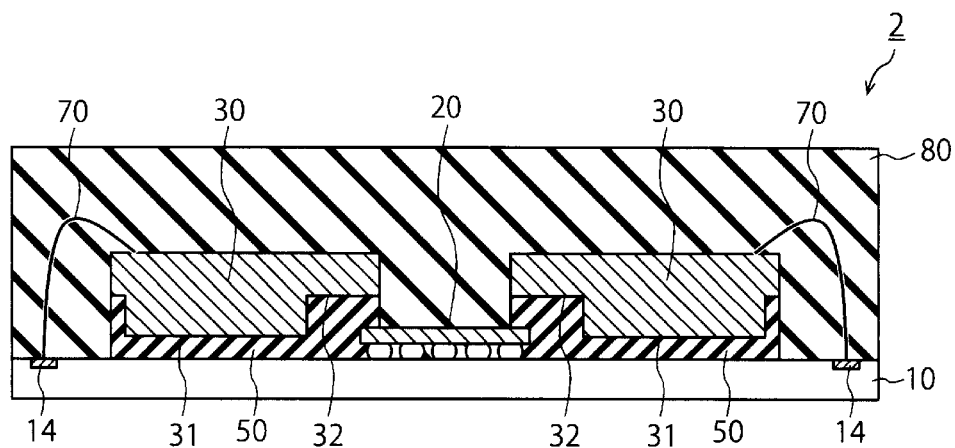
FIG. 10 illustrates a cross-sectional view of a semiconductor device according to a second embodiment.

FIG. 10 illustrates a cross-sectional view of a semiconductor device 2 according to a second embodiment. In the second embodiment, the controller chip 20 is a flip chip, in which wire bonding is not necessary. In a case where the controller chip 20 is a flip chip, the controller chip 20 is joined while a surface thereof having a semiconductor element faces the resin substrate 10. On the other hand, the reverse side of the controller chip 20 is located opposite the recess portion 32 of the memory chip 30. Accordingly, although the adhesion layer 50 covers the controller chip 20, the stress of the adhesion layer 50 is unlikely to be applied to the semiconductor element of the controller chip 20.

Therefore, in the second embodiment, the second area R2 protruding in the direction D1 on the side of the end portion E1 of the memory chip 30 is larger than that in the first embodiment. The recess portion 32 of the memory chip 30 is located above the controller chip 20. With this, the adhesion layer 50 is provided on the controller chip 20. This enables the adhesion layer 50 to protect a part of the controller chip 20.

The other constituent elements of the second embodiment may be set similar to those of the first embodiment. Moreover, the manufacturing method in the second embodiment may also be similar to that in the first embodiment. Accordingly, the second embodiment is able to attain an effect similar to that of the first embodiment.

Third Embodiment

Figure 11:
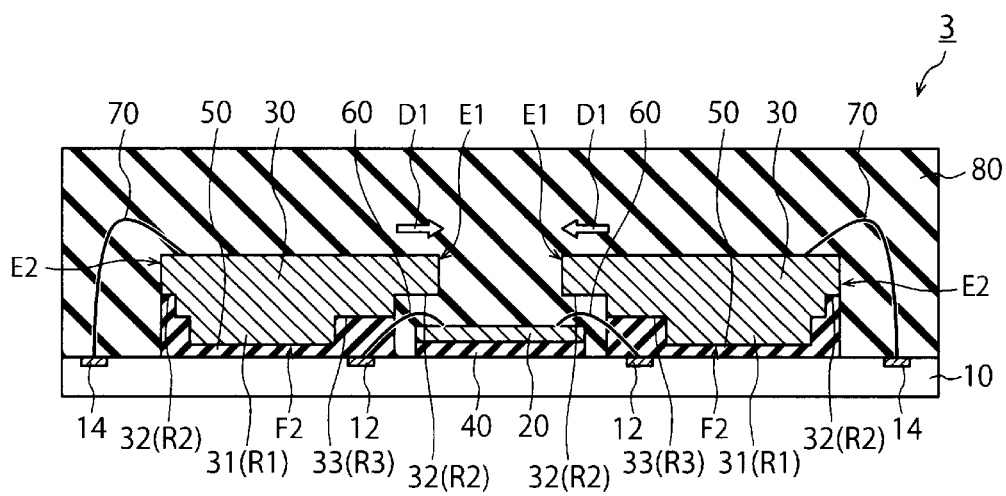
FIG. 11 illustrates a cross-sectional view of a semiconductor device according to a third embodiment.

FIG. 11 illustrates a cross-sectional view of a semiconductor device 3 according to a third embodiment. In the third embodiment, at the end portions E1 and E2 of the memory chip 30, a stepped portion 33 is provided in a third area R3 between the projecting portion 31 and the recess portion 32.

In other words, the reverse side F2 of the memory chip 30 in the third embodiment includes three steps, i.e., the projecting portion 31, the stepped portion 33, and the recess portion 32. The stepped portion 33 and the recess portion 32 are located above the metal wire 60 and/or the controller chip 20.

Moreover, in FIG. 11, the adhesion layer 50 is provided up to the stepped portion 33, but may be provided up to the recess portion 32. In a case where the adhesion layer 50 is provided up to the stepped portion 33, the adhesion layer 50 covers the metal wire 60. Although not illustrated, in a case where the adhesion layer 50 is provided up to the recess portion 32, the adhesion layer 50 covers the metal wire 60 and a part of the controller chip 20. In this case, the adhesion layer 50 is able to protect the entire metal wire 60, a joint portion between the metal wire 60 and the bonding pad 12, and a joint portion between the metal wire 60 and the controller chip 20.

Even if the stepped portion 33 is provided as in the third embodiment, the effect of the present embodiment is not lost. Moreover, even if the recess portion 32 is elongated in the direction D1 by the stepped portion 33 being provided, the mechanical strength of the memory chip 30 can be maintained. Furthermore, the number of stepped portions 33 to be provided between the projecting portion 31 and the recess portion 32 is not particularly limited. Accordingly, a plurality of stepped portions 33 may be provided between the projecting portion 31 and the recess portion 32 in such a way as to be formed in a staircase shape.

Fourth Embodiment

Figure 12:
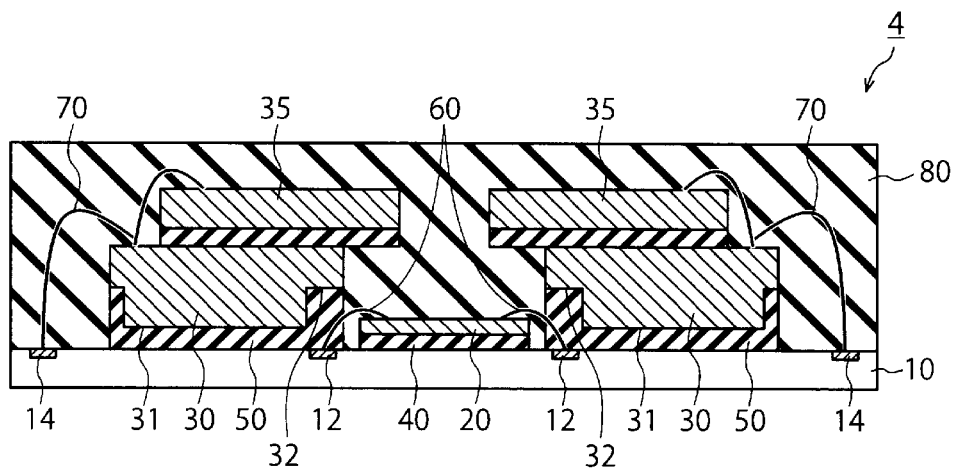
FIG. 12 illustrates a cross-sectional view of a semiconductor device according to a fourth embodiment.

FIG. 12 illustrates a cross-sectional view of a semiconductor device 4 according to a fourth embodiment. In the fourth embodiment, another memory chip (third semiconductor chip) 35 is stacked on the memory chip 30. The other constituent elements of the fourth embodiment may be set similar to those of the first embodiment.

In this way, the memory chip 35 may be stacked on the memory chip 30. However, the reverse side of the memory chip 35 does not include the projecting portion 31 and the recess portion 32 and is thus flat. Moreover, the number of memory chips 35 to be stacked on the memory chip 30 are not particularly limited. Even if another memory chip 35 is stacked on the memory chip 30 as in the fourth embodiment, the effect of the present embodiment is not lost.

Fifth Embodiment

Figure 13A:
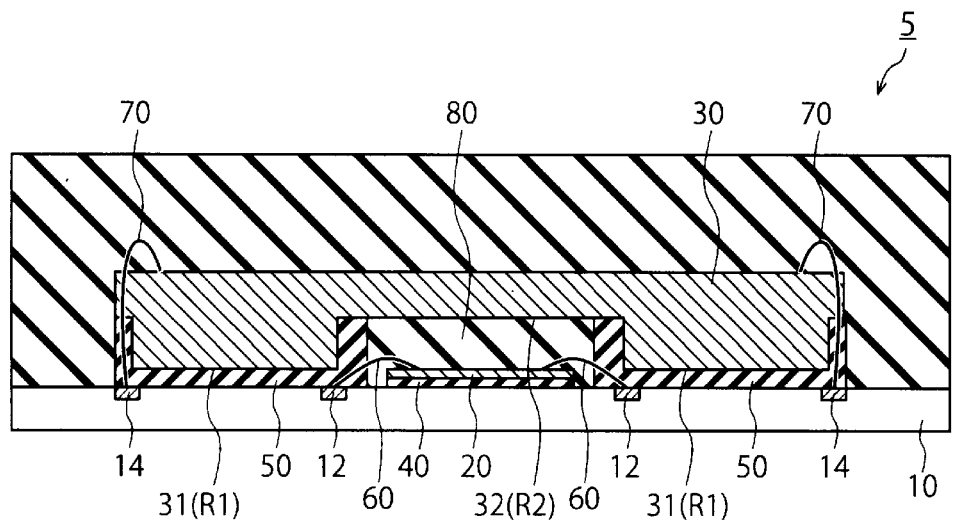
FIGS. 13A and 13B respectively illustrate a cross-sectional view and a plan view of a semiconductor device according to a fifth embodiment.
Figure 13B:
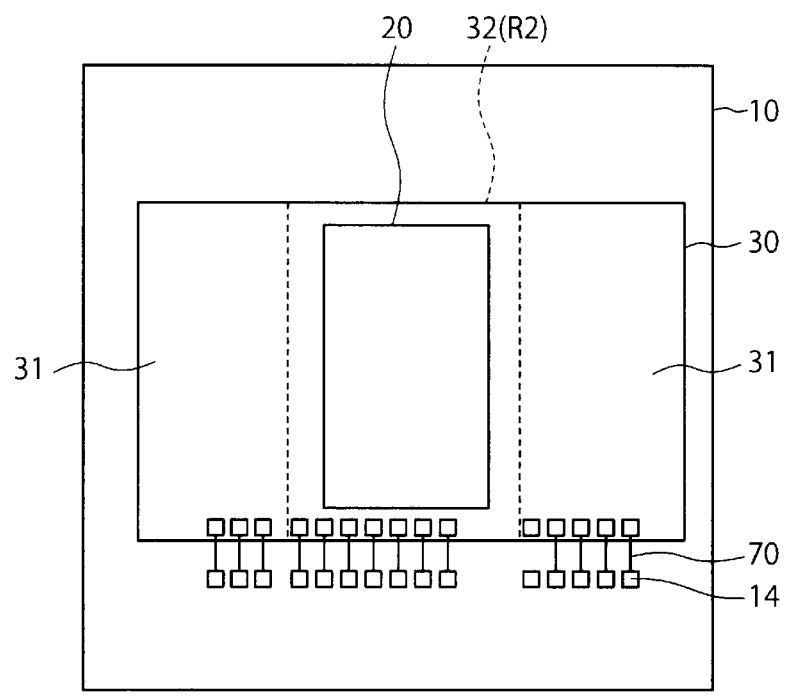

FIGS. 13A and 13B respectively illustrate a cross-sectional view and a plan view of a semiconductor device 5 according to a fifth embodiment. Furthermore, in the plan view of FIG. 13B, the controller chip 20 is illustrated only with an outline position thereof, and, for example, the metal wire 60 is omitted from illustration.

In the fifth embodiment, the memory chip 30 has, on the reverse side F2 thereof, a plurality of first areas R1, and a projecting portion 31 is provided in each of the first areas R1. With this, as illustrated in FIG. 13A, the reverse side F2 of the memory chip 30 is formed in an approximate U-shape in a cross-section perpendicular to the obverse side of the resin substrate 10. The memory chip 30 is provided across above the controller chip 20 in such a way as to straddle the controller chip 20, and the projecting portions 31 are bonded to the resin substrate 10 via the adhesion layer 50 at both sides of the controller chip 20. The controller chip 20 is located between two projecting portions 31, and a recess portion 32 is located above the controller chip 20. The recess portion 32 covers a portion above the obverse side of the controller chip 20. In this way, the memory chip 30 is not separated into right and left portions, and, thus, may be an integral-type chip. In a case where the memory chip 30 is an integral-type chip, the mechanical strength and stability of the memory chip 30 are improved. Therefore, the memory chip 30 can be prevented or reduced from curving, so that the number of memory chips 35 to be stacked can be increased.

The semiconductor device 5 can be formed in a manner similar to that of the semiconductor device 1 in the first embodiment if positions for trim processing of the semiconductor wafer 100 are changed. For example, in FIG. 4A in the first embodiment, the recess portion 32 in the second area R2 only needs to be formed between adjacent dicing lines DL. Furthermore, the width of the trim blade TB is set smaller than the width of each memory chip 30. With this, the recess portion 32 is formed in a central portion of the semiconductor chip and two projecting portions 31 are respectively formed on both sides of the recess portion 32. The dicing line DL corresponds to an intermediate position of the projecting portion 31. Accordingly, after dicing, each semiconductor chip is formed in an approximate U-shape having a recessed portion 32 at its central portion and having two projecting portions 31 on both sides of the recess portion 32. With regard to the above-described modification example 1, the semiconductor device 5 can also be manufactured in a similar way if positions for trim processing of the semiconductor wafer 100 are changed.

The method for manufacturing the semiconductor device 5 also includes the following manufacturing method.

Figure 14A:
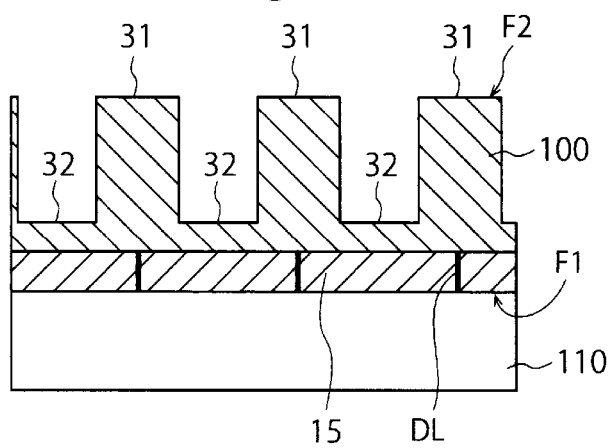
FIGS. 14A and 14B illustrate cross-sectional views of the semiconductor device to illustrate a method for manufacturing the semiconductor device according to the fifth embodiment.
Figure 14B:
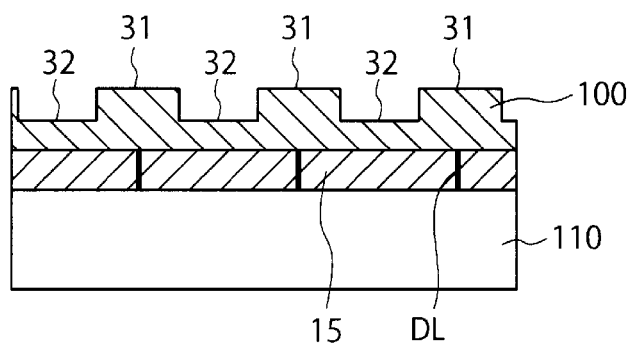

FIGS. 14A and 14B illustrate cross-sectional views of the semiconductor device 5 to illustrate a method for manufacturing the semiconductor device 5 according to the fifth embodiment. For example, after performing the processes described with reference to FIG. 2A to FIG. 3A, the recess portion 32 is formed in a central portion of the semiconductor chip between the dicing lines DL with use of a trim blade, as illustrated in FIG. 14A.

Next, the reverse side F2 of the semiconductor wafer 100 is polished with use of the CMP method. At this time, the reverse side F2 is polished until the projecting portion 31 of the reverse side F2 of the semiconductor wafer 100 reaches a desired height. With this, as illustrated in FIG. 14B, two projecting portions 31 are respectively formed on both sides of the recess portion 32.

After that, after performing the processes described with reference to FIG. 4B to FIG. 7, dicing on the semiconductor wafer 100 is performed. With this, the memory chip 30 such as that illustrated in FIG. 13A is formed. In this way, the reverse side F2 may be polished after the recess portion 32 is formed.

Sixth Embodiment

Figure 15:
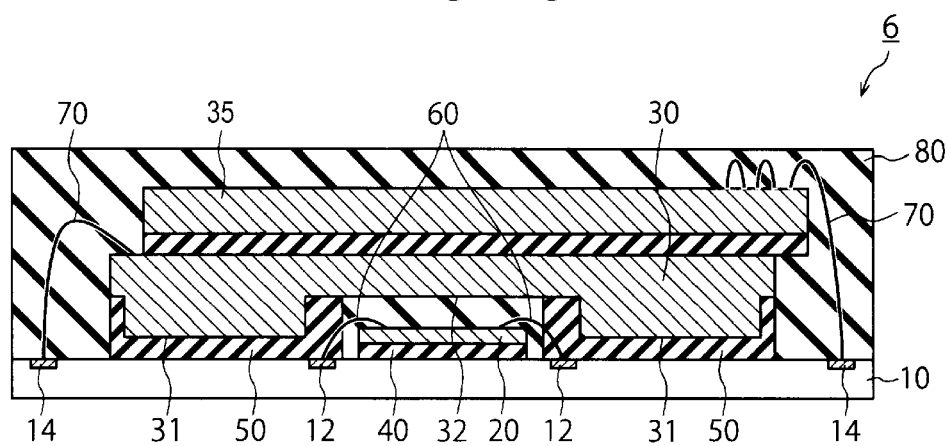
FIG. 15 illustrates a cross-sectional view of a semiconductor device according to a sixth embodiment.

FIG. 15 illustrates a cross-sectional view of a semiconductor device 6 according to a sixth embodiment. In the sixth embodiment, a further memory chip (third semiconductor chip) 35 is stacked on the memory chip 30. The other constituent elements of the sixth embodiment may be set similar to those of the fifth embodiment.

In this way, another memory chip 35 may be stacked on the memory chip 30. However, the reverse side of the memory chip 35 does not include the projecting portion 31 and the recess portion 32 and is thus flat. Moreover, the number of memory chips 35 to be stacked on the memory chip 30 are not particularly limited. Even if another memory chip 35 is stacked on the memory chip 30 as in the sixth embodiment, the effect of the present embodiment is not lost.

Seventh Embodiment

Figure 16:
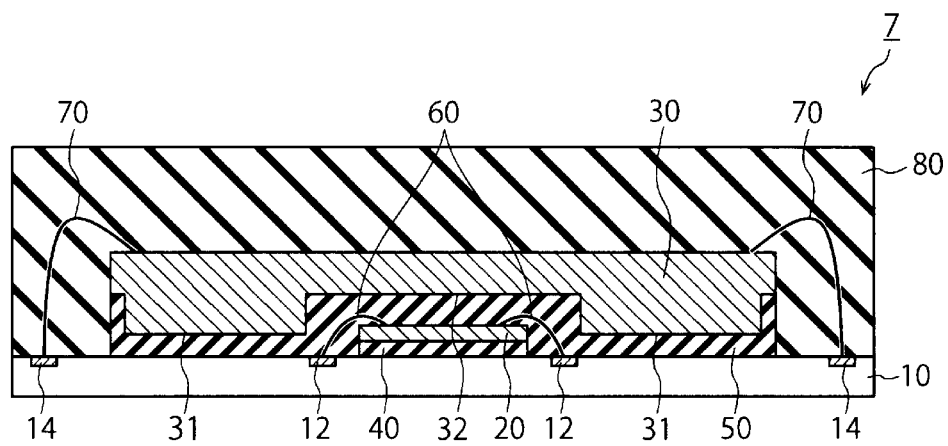
FIG. 16 illustrates a cross-sectional view of a semiconductor device according to a seventh embodiment.

FIG. 16 illustrates a cross-sectional view of a semiconductor device 7 according to a seventh embodiment. In the seventh embodiment, the adhesion layer 50 is provided in the entire space between the reverse side F2 of the memory chip 30 and the resin substrate 10. In other words, the adhesion layer 50 is provided not only between the projecting portion 31 and the resin substrate 10 but also between the recess portion 32 and the controller chip 20 or the resin substrate 10. The other constituent elements of the seventh embodiment may be set similar to those of the fifth embodiment.

In this way, if a space under the memory chip 30 is filled with the adhesion layer 50, the adhesion layer 50 covers the entire controller chip 20, so that an approximately even stress is applied to the controller chip 20. Accordingly, the seventh embodiment can also be applied to a case where the controller chip 20 is not of the flip chip type.

The seventh embodiment may be combined with the sixth embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a substrate;
a first semiconductor chip provided on a surface of the substrate;
a second semiconductor chip provided on the surface of the substrate, the second semiconductor chip including, on a side thereof facing the substrate, a first region that includes a center of the second semiconductor chip in a surface direction of the substrate in which the first and second semiconductor chips are aligned and a second region that is recessed from the first region and is above at least part of the first semiconductor chip or at least part of a wire that electrically connects the first semiconductor chip and the substrate, the first semiconductor chip being not provided between the first region and the surface of the substrate as seen in a plan view;
a first adhesion layer provided at least between the first region of the second semiconductor chip and the substrate;
a third semiconductor chip provided on the surface of the substrate, the third semiconductor chip including, on a side thereof facing the substrate, a third region that includes a center of the third semiconductor chip in a surface direction of the substrate in which the first and third semiconductor chips are aligned and a fourth region that is recessed from the third region and is above at least part of the first semiconductor chip or at least part of a wire that electrically connects the third first semiconductor chip and the substrate, the first semiconductor chip being not provided between the third region and the surface of the substrate as seen in the plan view;
a second adhesion layer provided at least between the third region of the third semiconductor chip and the substrate; and
a resin layer on the surface of the substrate and enclosing the first and second semiconductor chips,
the second semiconductor chip and the third semiconductor chip being at opposite sides of the first semiconductor chip.

2. The semiconductor device according to claim 1, wherein the first adhesion layer is in contact with at least part of the wire.

3. The semiconductor device according to claim 1, wherein the first adhesion layer is provided also between at least part of the second region of the second semiconductor chip and the substrate.

4. The semiconductor device according to claim 1, wherein
the second region of the second semiconductor chip is above at least part of the first semiconductor chip, and
the first adhesion layer is provided also between the second region of the second semiconductor chip and the at least part of the first semiconductor chip.

5. The semiconductor device according to claim 1, wherein
the second region of the second semiconductor chip is provided on a first side of the first region adjacent to the first semiconductor chip and a second side of the first region opposite to the first side, and
the first adhesion layer is provided also between at least part of the second region on the first side and the substrate, and between at least part of the second region on the second side and the substrate.

6. The semiconductor device according to claim 1, wherein the second region surrounds the first region.

7. The semiconductor device according to claim 1, wherein a difference between a thickness of the second semiconductor chip in the first region and a thickness of the second semiconductor chip in the second region is greater than a thickness of the first semiconductor chip.

8. The semiconductor device according to claim 1, wherein
the second semiconductor chip further includes, on the side thereof facing the substrate, a fifth region between the first region and the second region, the fifth region being recessed from the first region and the second region being recessed from the fifth region, and
the first adhesion layer is provided also between at least part of the fifth region of the second semiconductor chip and the substrate.

9. The semiconductor device according to claim 1, further comprising:
a fourth semiconductor chip provided on a surface of the second semiconductor chip facing away from the substrate, at least part of the fourth semiconductor chip overlapping the first semiconductor chip.

10. The semiconductor device according to claim 1, wherein the resin layer also encloses the third semiconductor chip.

11. The semiconductor device according to claim 1, wherein the first semiconductor chip is a controller chip, and each of the second and third semiconductor chips is a memory chip.

12. The semiconductor device according to claim 1, wherein a length of the first semiconductor chip in the surface direction is less than a length of the second semiconductor chip in the surface direction and less than a length of the third semiconductor chip in the surface direction.

13. A semiconductor device comprising:
- a substrate;
- a first semiconductor chip provided on a surface of the substrate;
- a second semiconductor chip provided on the surface of the substrate, the second semiconductor chip including, on a side thereof facing the substrate, a first region and a second region that is recessed from the first region and is above at least part of the first semiconductor chip or at least part of a wire that electrically connects the first semiconductor chip and the substrate;
- an adhesion layer provided at least between the first region of the second semiconductor chip and the substrate; and
- a resin layer on the surface of the substrate and enclosing the first and second semiconductor chips, wherein
- the first region of the second semiconductor chip is provided on a first side of the second region and a second side of the second region opposite to the first side, and
- the first semiconductor chip is between the first region of the second semiconductor chip on the first side and the first region of the second semiconductor chip on the second side.

14. The semiconductor device according to claim 13, wherein the second semiconductor chip overlaps entirety of the first semiconductor chip.

15. The semiconductor device according to claim 13, wherein the second region of the second semiconductor chip overlaps entirety of the first semiconductor chip.

16. The semiconductor device according to claim 13, wherein the adhesion layer is provided also between at least part of the second region of the second semiconductor chip and the substrate.

17. The semiconductor device according to claim 16, wherein the adhesion layer is provided also between at least part of the second region of the second semiconductor chip and the first semiconductor chip.

18. The semiconductor device according to claim 13, further comprising:
- a third semiconductor chip provided on a surface of the second semiconductor chip facing away from the substrate.

19. The semiconductor device according to claim 13, wherein the first semiconductor chip is a controller chip.

20. The semiconductor device according to claim 19, wherein the second semiconductor chip is a memory chip.

* * * * *

UNITED STATES PATENT AND TRADEMARK OFFICE
CERTIFICATE OF CORRECTION

| | |
|---|---|
| PATENT NO. | : 10,964,681 B2 |
| APPLICATION NO. | : 16/290488 |
| DATED | : March 30, 2021 |
| INVENTOR(S) | : Eigo Matsuura |

It is certified that error appears in the above-identified patent and that said Letters Patent is hereby corrected as shown below:

In the Claims

In Column 11, Claim 1, Line 66, please delete "third" after "the".

Signed and Sealed this
Seventeenth Day of May, 2022

Katherine Kelly Vidal
*Director of the United States Patent and Trademark Office*